United States Patent
Wu

(10) Patent No.: US 9,310,616 B2
(45) Date of Patent: Apr. 12, 2016

(54) 3D DISPLAY DEVICE AND MANUFACTURING METHOD THEREOF

(71) Applicant: BOE TECHNOLOGY GROUP CO., LTD., Beijing (CN)

(72) Inventor: Yanbing Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 125 days.

(21) Appl. No.: 13/824,738

(22) PCT Filed: Dec. 5, 2012

(86) PCT No.: PCT/CN2012/085982
§ 371 (c)(1),
(2) Date: Mar. 18, 2013

(87) PCT Pub. No.: WO2013/117098
PCT Pub. Date: Aug. 15, 2013

(65) Prior Publication Data
US 2014/0063382 A1    Mar. 6, 2014

(30) Foreign Application Priority Data
Feb. 9, 2012    (CN) .......................... 2012 1 0028990

(51) Int. Cl.
*G02B 27/22*    (2006.01)
*G02F 1/1335*    (2006.01)
(Continued)

(52) U.S. Cl.
CPC ...... *G02B 27/2214* (2013.01); *G02F 1/134363* (2013.01); *G02F 1/13624* (2013.01);
(Continued)

(58) Field of Classification Search
CPC .................. G02B 27/2214; G02F 1/133526; G02F 1/134309; G02F 1/13624; G02F 2001/134372; H01L 27/3267; H01L 51/50; H01L 51/5012; H01L 2227/32; H01L 2251/566; H01L 2924/10244; H01L 27/3225
USPC ............... 349/15, 141; 359/462, 463; 348/51; 353/7, 8; 345/419, 6
See application file for complete search history.

(56) References Cited

U.S. PATENT DOCUMENTS 8,378,944 B2    2/2013 Jeong et al.
2006/0012593 A1*    1/2006 Iriguchi et al. ................ 345/204
(Continued)

FOREIGN PATENT DOCUMENTS

CN    1721961 A    1/2006
CN    101470289 A    7/2009
(Continued)

OTHER PUBLICATIONS

First Chinese Office Action dated Mar. 22, 2013; Appln. No. 201210028990.0.
(Continued)

*Primary Examiner* — Thanh-Nhan P Nguyen
*Assistant Examiner* — Jia Pan
(74) *Attorney, Agent, or Firm* — Ladas & Parry LLP

(57) ABSTRACT

Embodiments of the present invention provide a 3D display device and a manufacturing method thereof, which can reduce production costs. The display device comprises a grating layer and an array substrate; the array substrate comprises a plurality of pixel-units, each pixel-unit comprising a pixel-electrode and a control-circuit; the pixel-electrode of each pixel-unit comprises mutually-spaced at least two left-viewing-field pixel-electrodes and at least two right-viewing-field pixel-electrodes; the control-circuit of each pixel-unit comprises a first sub-control-circuit connected with the left-viewing-field pixel-electrodes and a second sub-control-circuit connected with the right-viewing-field pixel-electrodes.

11 Claims, 7 Drawing Sheets

(51) Int. Cl.
  *G02F 1/1343* (2006.01)
  *G02F 1/1362* (2006.01)
  *H01L 51/50* (2006.01)
  *H01L 51/52* (2006.01)

(52) U.S. Cl.
  CPC ..... *G02F1/133512* (2013.01); *G02F 1/133526* (2013.01); *G02F 2001/134345* (2013.01); *G02F 2201/124* (2013.01); *H01L 51/50* (2013.01); *H01L 51/5209* (2013.01)

(56) References Cited

U.S. PATENT DOCUMENTS

| | | | |
|---|---|---|---|
| 2007/0008315 A1* | 1/2007 | Song et al. | 345/419 |
| 2008/0002079 A1* | 1/2008 | Kimura | 349/42 |
| 2009/0190074 A1 | 7/2009 | Woo et al. | |
| 2009/0243961 A1* | 10/2009 | Momose | 345/1.3 |
| 2009/0279005 A1 | 11/2009 | Fukushima et al. | |
| 2009/0279036 A1* | 11/2009 | Kim et al. | 349/139 |
| 2009/0309822 A1* | 12/2009 | Jeong et al. | 345/92 |
| 2009/0309958 A1* | 12/2009 | Hamagishi et al. | 348/54 |
| 2010/0245222 A1* | 9/2010 | Cho et al. | 345/89 |
| 2011/0063558 A1* | 3/2011 | Ishihara et al. | 349/141 |
| 2011/0141424 A1 | 6/2011 | Lee et al. | |
| 2011/0242442 A1* | 10/2011 | Lee et al. | 349/15 |
| 2011/0316843 A1 | 12/2011 | Sakurai et al. | |
| 2012/0038843 A1* | 2/2012 | Jung et al. | 349/41 |

FOREIGN PATENT DOCUMENTS

| | | |
|---|---|---|
| CN | 101547375 A | 9/2009 |
| CN | 101604101 A | 12/2009 |
| CN | 101609638 A | 12/2009 |
| CN | 101923257 A | 12/2010 |
| CN | 101957527 A | 1/2011 |
| CN | 101988998 A | 3/2011 |
| CN | 102096258 A | 6/2011 |
| CN | 102162958 A | 8/2011 |
| CN | 102289113 A | 12/2011 |
| CN | 102292666 A | 12/2011 |
| CN | 102629041 A | 8/2012 |
| CN | 102629607 A | 8/2012 |
| CN | 202443185 U | 9/2012 |
| JP | 2005-134663 A | 5/2005 |
| KR | 20090130826 A | 12/2009 |

OTHER PUBLICATIONS

Second Chinese Office Action dated May 21, 2013; Appln. No. 201210028990.0.
Third Chinese Office Action dated Jul. 19, 2013; Appln. No. 201210028990.0.
Fourth Chinese Office Action dated Nov. 29, 2013; Appln. No. 201210028990.0.
Korean Office Action dated Feb. 5, 2014; Appln. No. 10-2013-7010105.
International Search Report; Mar. 14, 2013; PCT/CN2012/085982.
International Preliminary Report on Patentability dated Aug. 12, 2014: PCT/CN2012/085982.
International Search Report dated May 3, 2013; PCT/CN2012/087238.
First Chinese Office Action Dated Mar. 5, 2013; Appln. No. 201210063694.4.
Second Chinese Office Action dated Jun. 3, 2013; Appln. No. 201210063694.4.
Third Chinese Office Action dated Oct. 28, 2013; Appln. No. 201210063694.4.
Chinese Rejection Decision dated Nov. 4, 2014; Appln. No. 201210063694.4.
International Preliminary Report on Patentability dated Aug. 12, 2014; PCT/CN2012/087238.
USPTO NFOA dated Jan. 6, 2015 in connection with U.S. Appl. No. 13/994,740.
USPTO FOA dated Apr. 30, 2015 in connection with U.S. Appl. No. 13/994,740.
Extended European Search Report dated Oct. 16, 2015, Appln. No. 12832731.9-1904 /2813886 PCT/CN2012085982.
USPTO NFOA dated Aug. 24, 2015 in connection with U.S. Appl. No. 13/994,740.

* cited by examiner

Pixel display effect of an existing technology

Pixel display effect of an embodiment of the invention

3D DISPLAY DEVICE AND MANUFACTURING METHOD THEREOF

TECHNICAL FIELD

Embodiments of the present invention relate to a 3D display device and a manufacturing method thereof.

BACKGROUND

Compared with a double-dimension (2D) display device, a three-dimension (3D) display device usually needs a specific grating layer installed additionally. Methods for realizing a grating layer of the current mainstream 3D display device are mainly divided into two types: a parallax barrier method and a lens-grating method.

The basic principle of the parallax barrier method is as shown in FIG. 1. A left-viewing-field pixel 11 of a display panel 1 displays a left-eye image, while a right-viewing-field pixel 12 displays a right-eye image. A parallax barrier 13, as a grating layer, is placed in front of the display panel 1, and the parallax barrier 13 is composed of light-shielding stripes and light-transmissive stripes, which are alternated. The light-shielding stripes of the parallax barrier 13 block light from a right-eye image for a viewer's left eye, and block light emitted from a left-eye image for the viewer's right eye. The viewer separately watches different images with his left and right eyes, and eventually combines the images to obtain a stereo perception. The distance between a typical viewer's two eyes is an interpupillary distance T of human, which is about 60 mm. As an example, for a general display device, the width of a pixel is P=60 μm, and the viewing distance is set to L=300 mm; then, with reference to FIG. 1, the distance H between the parallax barrier and a light-emitting point of the display panel can be roughly calculated with the following expression:

$$H = \frac{L*P}{T} \qquad \text{(Expression 1)}$$

As can be seen, under normal circumstances, the distance H between the parallax barrier and a light-emitting point of the display unit needs to be 0.3 mm or so. In order to ensure that the distance H between the parallax barrier and a light-emitting point of the display unit reaches this height, usually an layer of parallax barrier is required to be additionally provided on the display device which has been formed by a cell-assembling process after the display device is manufactured. Thus, on the basis of the existing production method, a new process has to be added or new production equipments have to be employed, which will result in an increase of the production costs of a 3D display device.

The lens-grating method refers to that a lenticular lens is placed in front of a display panel and functions as a grating layer; the left-viewing-field sub-pixels on the display panel display a left-eye image, and the right-viewing-field sub-pixels display a right-eye image; the light emitted from the pixels of the left- and right-viewing-fields is deflected in its propagation direction when passing through the lenticular lens grating due to the refraction effect of the lenticular lens grating, so that the light from the left-viewing-field pixels is incident into the left eye of a viewer, and the light from the right-viewing-field pixels is incident into the right eye of the viewer, which both are finally used to produce a 3D effect. FIG. 2 is a simplified structure of a lenticular lens grating 3D display. A light-emitting point of the display unit is located in the focal plane of the lenticular lens, and the focal length is denoted as f. The distance from the lower surface of the lenticular lens to a light-emitting point of the display unit is denoted as H, and here f=H. The width of each pixel of the viewing-fields is denoted as P, and the pitch of the grating is approximately equal to 2P. The refractive index of the lens is denoted as n2, and the refractive index outside of the lens is denoted as n1. The radius of the lens is denoted as r, and the arch-height of the lens is denoted as g. Thus, there is an expression as follows:

$$g - r = \frac{n1}{n2} * \sqrt{H^2 + P^2} - H \qquad \text{Expression 2}$$

The arch-height g of a lens is an important parameter. The width P of each pixel of the viewing-fields is about 60 μm; n2 is the refractive index of a common resin, which is about 1.5; n1 is the refractive index of air, which is 1; generally H is the thickness of an upper glass substrate, which is about 0.5 mm; the radius of a lens is r, and for a perfect lens, r=f(n2−1). With the expression 2, it can be calculated that, in the existing structure, the arch-height g of a lens is at least more than 11 μm. It is meant that, the higher the arch-height of the lens is, the larger the thickness of the lens-grating layer is; however, a lens-grating layer having a relatively large thickness is difficult to be manufactured with the existing patterning processes. In order to accord with changes in product specifications, a new process has to be added or new production equipments have to be employed on the basis of the existing production method, which will result in an increase of the production costs of a 3D display device.

As can be seen, it is difficult for the existing 3D display device to solve such problem that, the production costs are increased in the manufacturing processes of a grating layer, because a parallax barrier is required to be additionally attached on the display device which has been formed by a cell-assembling process, or because the arch-height of the lens needs to be increased.

SUMMARY

Embodiments of the present invention provide a 3D display device and a manufacturing method thereof, and a parallax barrier can be manufactured within a display device, which avoids adding new processes or employing new production equipments, thereby reducing production costs.

One aspect of the present invention provides a 3D liquid crystal display device, which comprises: a grating layer, an array substrate and a counter substrate, wherein the array substrate and the counter substrate are disposed opposite to each other to form a liquid crystal cell; the grating layer comprises a parallax barrier or a lens-grating; liquid crystal is filled between the array substrate and the counter substrate; the array substrate comprises a plurality of pixel-units divided by gate lines and data lines intersecting one another horizontally and vertically, each pixel-unit comprising a pixel-electrode and a control-circuit, wherein the pixel-electrode of each pixel-unit comprises mutually-spaced at least two left-viewing-field pixel-electrodes and at least two right-viewing-field pixel-electrodes; the control-circuit of each pixel-unit comprises a first sub-control-circuit connected with the left-viewing-field pixel-electrodes and a second sub-control-circuit connected with the right-viewing-field pixel-electrodes.

Another aspect of the present invention provides a 3D-OLED display device, which comprises: a grating layer, an array substrate and an encapsulation layer, wherein the grating layer comprises a parallax barrier or a lens-grating; the array substrate comprises a plurality of pixel-units divided by gate lines and data lines intersecting one another horizontally and vertically, each pixel-unit comprising an electroluminescent EL layer and a control-circuit; the EL layer comprises a metal cathode, a pixel-electrode and an organic light-emitting material located between the metal cathode and the pixel-electrode, wherein the pixel-electrode of each pixel-unit comprises mutually-spaced at least two left-viewing-field pixel-electrodes and at least two right-viewing-field pixel-electrodes; the control-circuit of each pixel-unit comprises a first sub-control-circuit connected with the left-viewing-field pixel-electrodes and a second sub-control-circuit connected with the right-viewing-field pixel-electrodes.

Further another aspect of the present invention provides a manufacturing method of a three-dimensional (3D) liquid crystal display device, which comprises: on a lower substrate, forming a control-circuit and a pixel-electrode, wherein the pixel-electrode of each pixel-unit comprises mutually-spaced at least two left-viewing-field pixel-electrodes and at least two right-viewing-field pixel-electrodes; the control-circuit of each pixel-unit comprises a first sub-control-circuit connected with the left-viewing-field pixel-electrodes and a second sub-control-circuit connected with the right-viewing-field pixel-electrodes; on an upper substrate, forming a grating layer, the grating layer comprising a parallax barrier or a lens-grating; and disposing the upper substrate and the lower substrate opposite to each other, liquid crystal being filled between the upper and lower substrates.

Still another aspect of the present invention provides a manufacturing method of a 3D-OLED display device, which comprises: on a lower substrate, forming a control-circuit; on the lower substrate formed with the control-circuit, forming an EL layer, and the EL layer comprises a metal cathode, a pixel-electrode and an organic light-emitting material located between the metal cathode and the pixel-electrode; the pixel-electrode of each pixel-unit comprises mutually-spaced at least two left-viewing-field pixel-electrodes and at least two right-viewing-field pixel-electrodes; the control-circuit of each pixel-unit comprises a first sub-control-circuit connected with the left-viewing-field pixel-electrodes and a second sub-control-circuit connected with the right-viewing-field pixel-electrodes; on an encapsulation layer, forming a grating layer, the grating layer comprising a parallax barrier or a lens-grating; and disposing the encapsulation layer formed with the grating layer to cover the lower substrate.

Yet another aspect of the present invention provides a 3D display device, which comprises a grating layer and an array substrate; the array substrate comprises a plurality of pixel-units, each pixel-unit comprising a pixel-electrode and a control-circuit; the pixel-electrode of each pixel-unit comprises mutually-spaced at least two left-viewing-field pixel-electrodes and at least two right-viewing-field pixel-electrodes; the control-circuit of each pixel-unit comprises a first sub-control-circuit connected with the left-viewing-field pixel-electrodes and a second sub-control-circuit connected with the right-viewing-field pixel-electrodes.

The 3D display device may be a liquid crystal display device, and thus may further comprise a counter substrate which is disposed opposite to the array substrate to form a liquid crystal cell. The 3D display device may further be an OLED display device, and thus may further comprise an encapsulated layer for encapsulating an EL light-emitting structure formed on the array substrate.

The 3D display device and the manufacturing method thereof provided by the embodiments of the present invention, by modifying a sub-pixel-electrode, which is used for displaying a certain viewing-field, in one pixel-unit in prior art into mutually-spaced several left-viewing-field pixel-electrodes and right-viewing-field pixel-electrodes, significantly reduces the width of a single viewing-field pixel-electrode. The reduction of the width of the single viewing-field pixel-electrode can reduce the thickness of the grating layer, when the grating layer is a parallax barrier, the reduction in the thickness of the parallax barrier makes it possible that the parallax barrier can be manufactured directly within the cell of the display device, without a layer of parallax barrier being additionally manufactured on the display device which has been formed by cell-assembling; when the grating layer is a lens-grating, the reduction in the thickness of the lens-grating can reduce the arch-height of the lenticular lens. Thus, the production requirements can be met with the existing manufacturing processes, which can avoid adding new processes or employing new production equipments, thereby reducing production costs.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, technical or scientific terms used herein should be interpreted in the usual sense as understood by those ordinary skilled in the relevant art of the present invention. The terms "first", "second", and the like, used in the specification and claims of this patent application of the invention, do not denote any order, quantity, or importance, but are used to distinguish among different integral parts. Similarly, the terms "a", "an", "the" and the like, herein do not denote a limitation of quantity, but rather denote the presence of at least one of the referenced item. The words "comprising" or "including" or the like are referred to that the elements or objects which appear before "comprising" or "including" encompass the elements or objects and their equivalents which are enumerated after "comprising" or "including", and do not exclude other elements or objects. The words "connection" or "connected" or the like, are not limited to physical or mechanical connections, but can comprise electrical connection, whether direct or indirect. Wordings such as "upper", "lower", "left", "right" and the like, are only used to indicate a relative positional relationship, which may also be correspondingly changed as an absolute position of a described object is changed.

Figure 1:
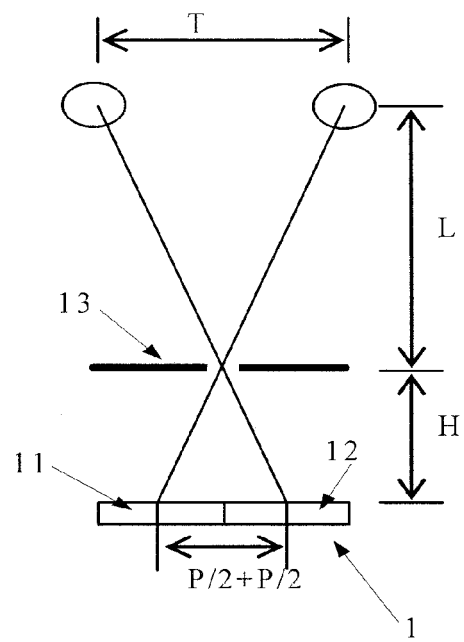
FIG. 1 is a schematic diagram illustrating the principle of a parallax barrier method in prior art.
Figure 2:
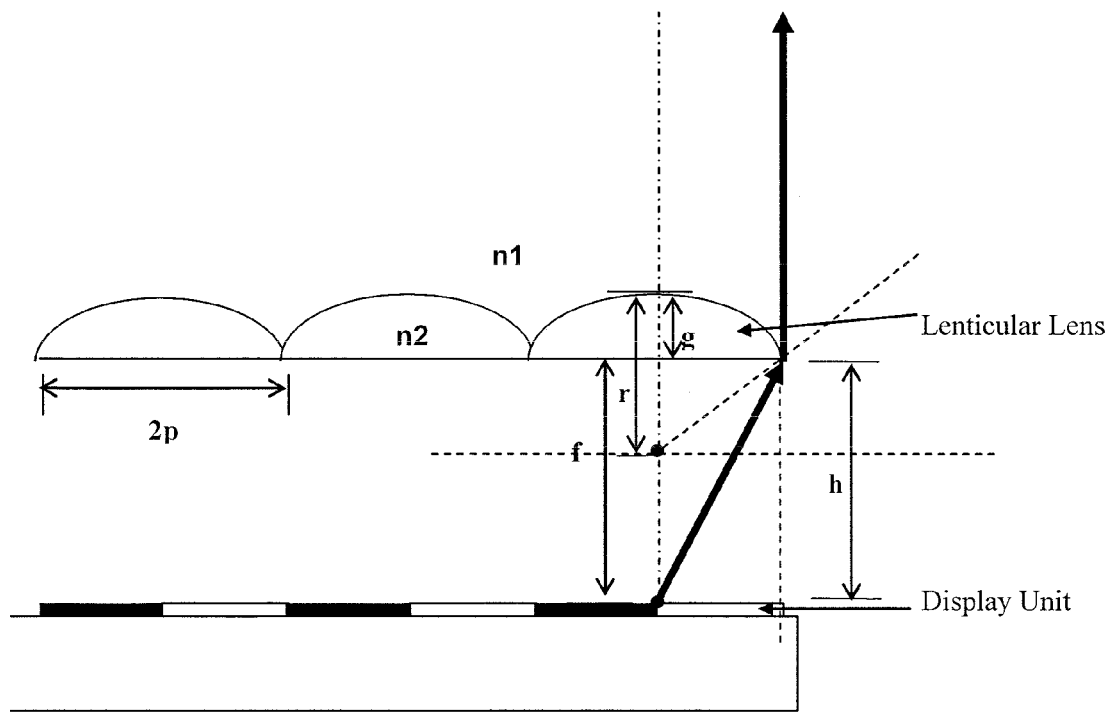
FIG. 2 a schematic diagram illustrating the principle of a lens-grating method in prior art.
Figure 3:
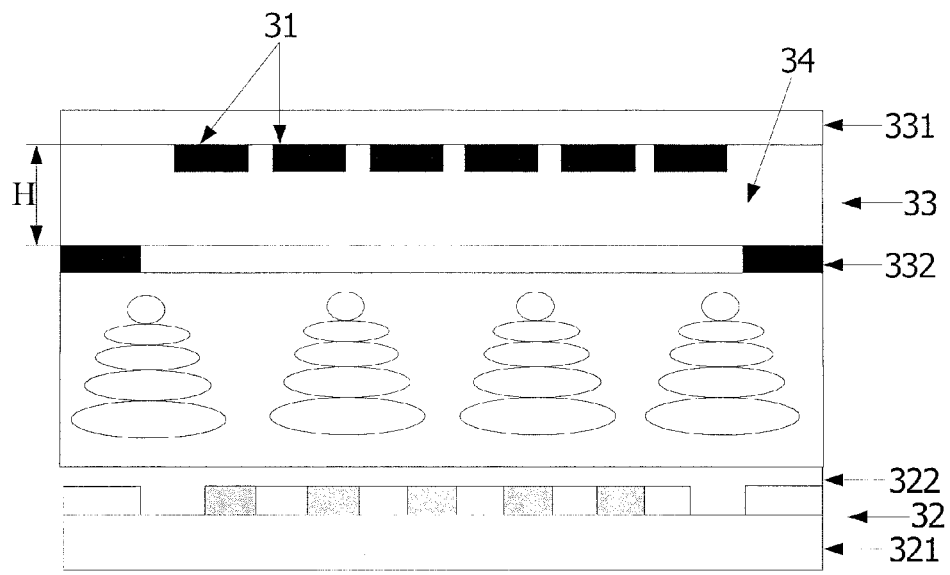
FIG. 3 is a schematic structural diagram of a 3D liquid crystal display device provided by an embodiment of the invention.

An embodiment of the present invention provides a 3D liquid crystal display device, as shown in FIG. 3, the liquid crystal display device comprises: a grating layer 31, a TFT array substrate 32 and a color-filter substrate 33. The TFT array substrate 32 and the color-filter substrate 33 are disposed opposite to each other to form a liquid crystal cell, in which a liquid crystal material is contained. The TFT array substrate 32 is an example of an array substrate in the present invention; the color-filter substrate 33 is an example of an counter substrate which is provided opposite to the array substrate in the present invention, for example when the array substrate has color-filters provided thereon; and the counter substrate may have no color-filters provided thereon, that is, it is no longer a color-filter substrate.

Figure 4:
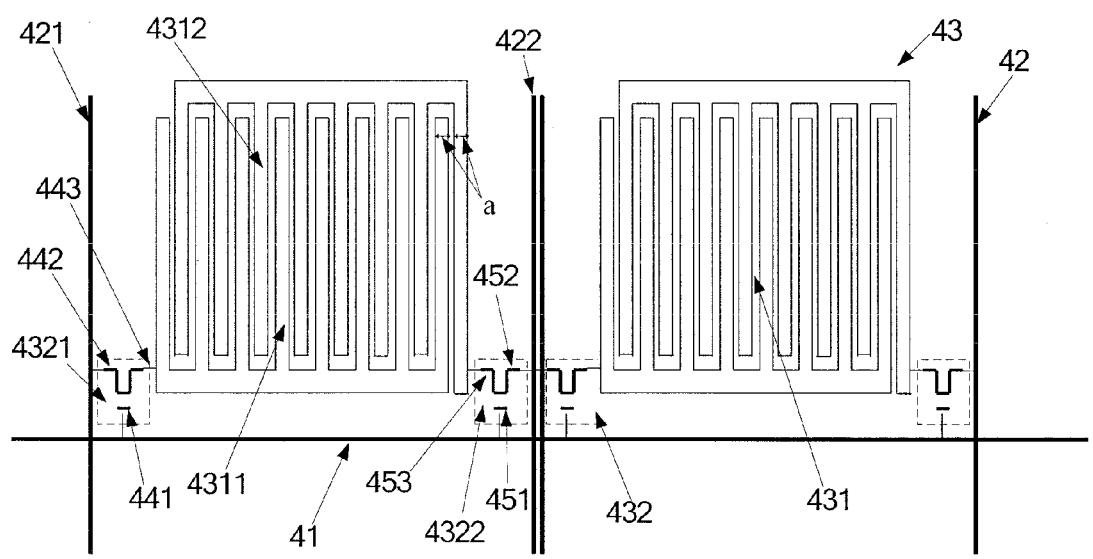
FIG. 4 is a schematic structural diagram of a TFT array substrate of a 3D liquid crystal display device provided by an embodiment of the invention.

The grating layer 31 may comprise a parallax barrier or a lens-grating; the color-filter substrate 33 comprises a transparent substrate 331 and a color-filter 332; the color-filters 332 comprise, for example, red, green, and blue sub-pixel-units, and these sub-pixel-units are spaced from one another by a black matrix; liquid crystal is filled between the TFT array substrate 32 and the color-filter substrate 33; as shown in FIG. 4, the TFT array substrate 32 comprises a plurality of pixel-units 43 divided by gate lines 41 and data lines 42 intersecting one another horizontally and vertically, and each pixel-unit 43 comprises a pixel-electrode 431 and a TFT circuit 432. The TFT circuit is an example of a pixel control-circuit in the present invention.

The pixel-electrode 431 of each pixel-unit 43 comprises at least two left-viewing-field pixel-electrodes 4311 and at least two right-viewing-field pixel-electrodes 4312, which are separated from each other.

The TFT circuit 432 of each pixel-unit 43 comprises a first sub-TFT-circuit 4321 connected with the left-viewing-field pixel-electrodes 4311 and a second sub-TFT-circuit 4322 connected with the right-viewing-field pixel-electrodes 4312. That is, all the left-viewing-field pixel-electrodes 4311 are connected with the first sub-TFT-circuit 4321, and all the right-viewing-field pixel-electrodes 4312 are connected with the second sub-TFT-circuit 4322. Each left-viewing-field pixel-electrode 4311 may be connected, through any structure (e.g., a via hole) that can realize circuit conduct, to the first sub-TFT-circuit 4321; each right-viewing-field pixel-electrode 4312 may be connected, through any structure—(e.g., a via hole) that can realize circuit conduct, to the second sub-TFT-circuit 4322.

The 3D liquid crystal display device provided by the embodiment of the present invention, by modifying a sub-pixel-electrode, which is used for displaying a certain viewing-field, in one pixel-unit in prior art into mutually-spaced left-viewing-field pixel-electrodes and right-viewing-field pixel-electrodes, significantly reduces the width of a single viewing-field pixel-electrode. The reduction of the width of the single viewing-field pixel-electrode can reduce the thickness of the grating layer. Therefore, when the grating layer is a parallax barrier, the reduction of the thickness of the parallax barrier makes it possible that the parallax barrier can be manufactured directly within the cell of the display device, without a layer of parallax barrier being additionally manufactured on the display device which has been formed by cell-assembling; when the grating layer is a lens-grating, the reduction of the thickness of the lens-grating can reduce the arch-height of the lenticular lenses. Thus, the production requirements can be met with the existing manufacturing processes, which can avoid adding new processes or employing new production equipments, thereby reducing production costs.

It should be noted that, the mutually-spaced at least two left-viewing-field pixel-electrodes 4311 and at least two right-viewing-field pixel-electrodes 4312 may be all elongated strip-like electrodes. These mutually-spaced at least two left-viewing-field pixel-electrodes 4311 and at least two right-viewing-field pixel-electrodes 4312 may be parallel to the gate lines 41, or may be parallel to the data lines 42.

For the 3D liquid crystal display device provided by the embodiment of the present invention, a description is given by taking the example in which the mutually-spaced at least two left-viewing-field pixel-electrodes 4311 and at least two right-viewing-field pixel-electrodes 4312 are parallel to the data lines 42.

In the embodiment of the present invention, the transparent substrate may be a transparent-material substrate for encapsulating a liquid crystal display device. For example, the transparent substrate may be a glass substrate or a transparent resin substrate.

Further, as shown in FIG. 4, in the 3D liquid crystal display device provided by the embodiment of the present invention, in each pixel-unit 43, all the left-viewing-field pixel-electrodes 4311 constitute a first comb-like structure, and all the right-viewing-field pixel-electrodes 4312 constitute a second comb-like structure, the first comb-like structure and the second comb-like structure being disposed mutually-interdigitated; that is, all the left-viewing-field pixel-electrodes 4311 and all the right-viewing-field pixel-electrodes 4312 may be mutually-spaced in a comb-like structure as a whole.

Preferably, the left-viewing-field pixel-electrode 4311 and the right-viewing-field pixel-electrode 4312 have an equal width; in this embodiment, they both have a width "a", which may be 1-20 μm. Of course, the left-viewing-field pixel-electrode 4311 and the right-viewing-field pixel-electrode 4312 may not have an equal width as well.

Preferably, in each pixel-unit 43, the left-viewing-field pixel-electrodes 4311 and the right-viewing-field pixel-electrodes 4312 are equal in number, in which case a better display effect can be achieved. In the embodiment shown in FIG. 4a, in each pixel-unit 43, the numbers of the left-viewing-field pixel-electrodes 4311 and the right-viewing-field pixel-electrodes 4312 both are 8.

Figure 5:
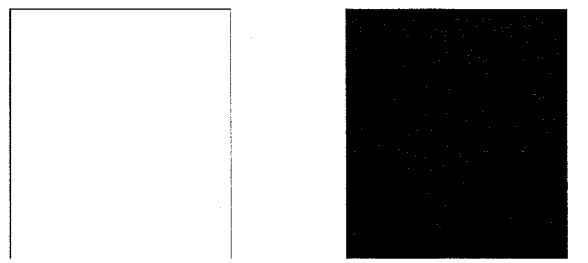
FIG. 5 is a comparison diagram of the pixel display effects of a 3D liquid crystal display device provided by an embodiment of the invention and an existing liquid crystal display device.
Figure 5:
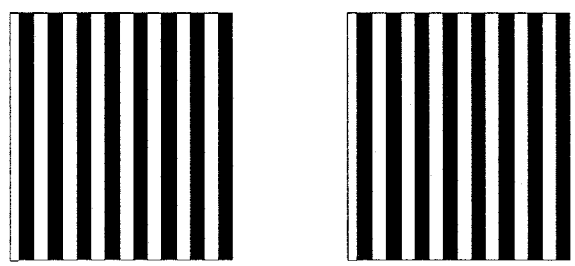

In the embodiment of the present invention, the existing single plate-like viewing-field sub-pixel-electrodes in two adjacent pixel-units are changed into mutually-interdigitated comb-like left-viewing-field pixel-electrodes and right-viewing-field pixel-electrodes in a same pixel-unit. When the pixels of two viewing-fields display different colors, if the impact of the micro electric field between the pixel-electrodes of these two viewing-fields on the liquid crystal is ignored, then a contrast of the pixel display effects of a double-viewing-field liquid crystal display device provided by the embodiment of the present invention versus an existing liquid crystal display device, can be as shown in FIG. 5. It can be clearly seen that, compared to the prior art, the liquid crystal display device provided by the embodiment of the present invention significantly reduces the width of a single viewing-field pixel-electrode. Since the width of a single viewing-field pixel-electrode in such a pixel structure is far less than that in a sub-pixel-electrode structure in prior art, such a pixel structure thus can be named as "micro-pixel structure."

Further, as shown in FIG. 4, the gate 441 of the first sub-TFT-circuit 4321 and the gate 451 of the second sub-TFT-circuit 4322 may be connected with a same gate line 41; the source 442 of the first sub-TFT-circuit 4321 and the source 452 of the second sub-TFT-circuit 4322 may be respectively connected with the data lines 421 and 422 on both sides of one pixel-unit; the drain 443 of the first sub-TFT-circuit 4321 may be connected with the left-viewing-field pixel-electrodes 4311, and the drain 453 of the second sub-TFT-circuit 4322 may be connected with the right-viewing-field pixel-electrodes 4312.

Thus, the pixel-electrodes of a same viewing-field share a same data line, a same gate line and a same TFT, so that the aperture ratio of the pixel is decreased limitedly, thereby avoiding the problem that the aperture ratio of the liquid crystal display device is decreased significantly.

Furthermore, when the grating layer 31 is a parallax barrier, the parallax barrier may be located between the transparent substrate 331 and the TFT array substrate 32, and the parallax barrier may be located above or below the color-filter 332 and may be in a distance of 1-100 μm from the color-filter 332. For example, the parallax barrier may be located between the transparent substrate 331 and the TFT array substrate 32, also the parallax barrier may be located between the TFT array layer 322 and the transparent substrate 321 of the TFT array substrate 32.

When the grating layer 31 is a lens-grating, the lens-grating may be located above the transparent substrate 331.

When the grating layer 31 is a parallax barrier and the parallax barrier is located above the color-filter 332, as shown in FIG. 3, a transparent layer 34 having a thickness of 1-100 μm may be provided between the parallax barrier and the color-filter 332.

The transparent layer 34 may be a transparent thin-film formed of any light-transmissive material; for example, a plastic thin-film or a silicone rubber thin-film may be used to form this transparent layer. The transparent layer 34 is mainly used to create a space having a certain height between the grating layer 31 and the color-filter 332, and the thickness of the transparent layer 34 is the distance H between the parallax barrier and a light-emitting point of the display unit.

Figure 6:
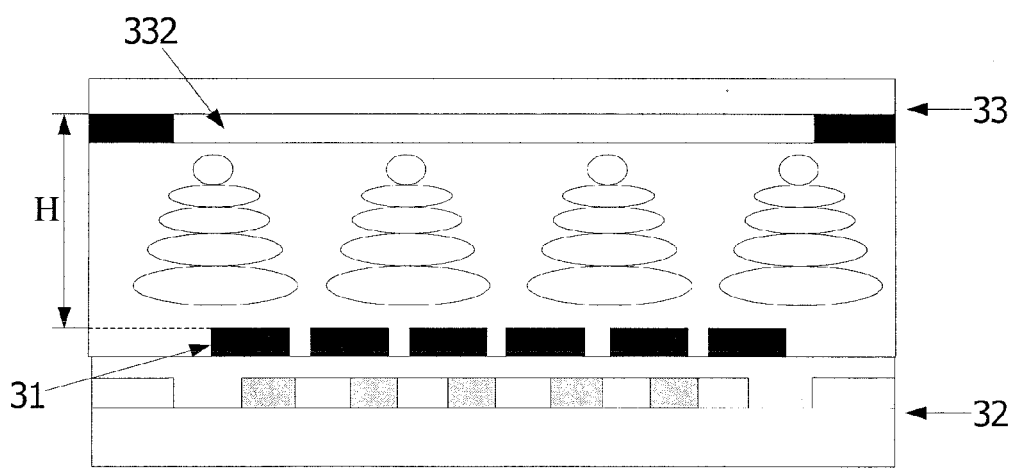
FIG. 6 is a schematic structural diagram of another 3D liquid crystal display device provided by an embodiment of the invention.

When the grating layer 31 is a parallax barrier and the parallax barrier is located below the color-filter 332, the example is shown in FIG. 6.

The parallax barrier may be located directly on the upper surface of the TFT array substrate 32.

Since the distance from a light-emitting point on the upper surface of the TFT array substrate to the parallax barrier typically comprises all the thicknesses of a color-filter, an array and a liquid crystal alignment film, and the sum of these thicknesses is usually 4-7 μm. Thus, in the case where no transparent layer works as a spacer, the requirement can still be met that the distance H between the parallax barrier and the light-emitting point of the color-filter is to be within the range of 1-100 μm, thereby simplifying processes and saving costs.

In the embodiment of the present invention, if it is assumed that, the width P of a pixel is 2 μm; the interpupillary distance T of a human is 60 mm; the viewing distance is also set as L=300 mm. With the expression 1, it can be calculated that the distance H between the parallax barrier and the light-emitting point of the display unit is 10 μm. Obviously, such a distance can be obtained by manufacturing the parallax barrier within the cell of the display device.

When the grating layer 31 is a lens-grating, the lens-grating may comprise a liquid crystal lens grating or a lenticular lens grating.

Figure 7:
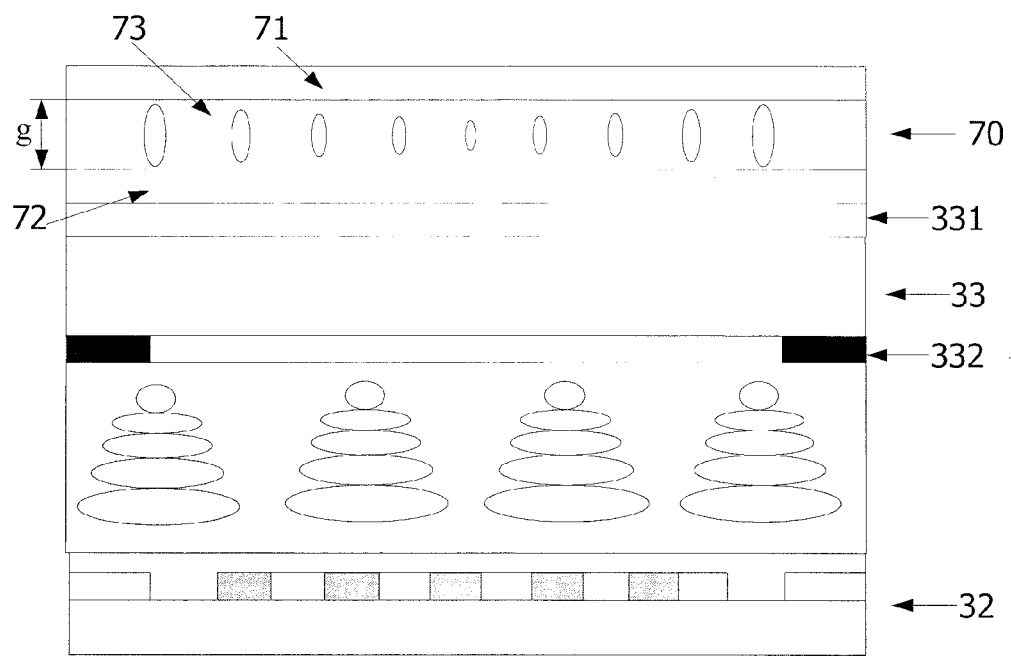
FIG. 7 is a schematic structural diagram of further another 3D liquid crystal display device provided by an embodiment of the invention.

Further, when the grating layer 31 comprises a liquid crystal lens, as shown in FIG. 7, the liquid crystal lens 70 comprises an upper electrode 71 and a lower electrode 72; liquid crystal is filled between the upper electrode 71 and the lower electrode 72 to form a liquid crystal layer 73, and the thickness "g" of the liquid crystal cell is equal to the arch-height of the lenticular lens. With such a structure, the voltage distribution on the electrodes is controlled so that the liquid crystal molecules in different positions are controlled to deflect to realize the function of a lenticular lens. Thus, when the upper electrode 71 and lower electrode 72 are not energized, the liquid crystal molecules do not deflect, so that the display device can perform 2D-mode display; when the upper electrode 71 and the lower electrode 72 are energized, the liquid crystal molecules deflect, so that the display device can perform 3D-mode display.

Figure 8:
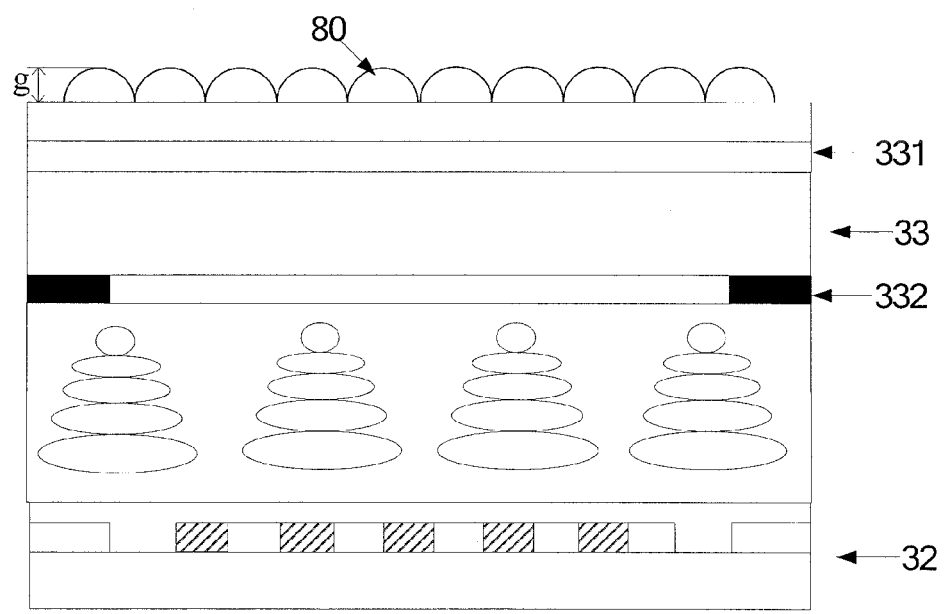
FIG. 8 is a schematic structural diagram of still another 3D liquid crystal display device provided by an embodiment of the invention.

When the grating layer 31 is a lenticular lens grating, as shown in FIG. 8, the lenticular lens grating 80 may be obtained by firstly depositing a layer of transparent photoresist on the transparent substrate 331 and then exposing and developing with a grayscale exposure mask plate and different exposure amount, and the arch-height of the lens is "g."

In the embodiment of the present invention, if it is assumed that, the width P of a pixel is 10 μm, n2 is the refractive index of a common resin, which is about 1.5, n1 is the refractive index of air, which is 1, H is generally the thickness of a transparent substrate, which is approximately 0.5 mm, and the radius of the lens is r=f(n2−1), then with the expression 2, it can be calculated that the arch-height of the lens is about 5 μm. Obviously, the above-described structure can achieve a reduction in the thickness of the display device.

Figure 9:
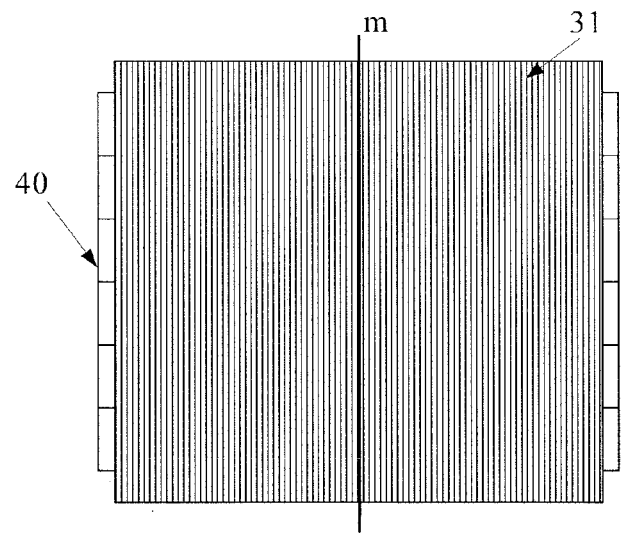
FIG. 9 is a schematic structural diagram of a TFT array substrate of a display device provided by an embodiment of the invention.

Further, as shown in FIG. 9, the centerline of the grating layer 31 and the centerline of the display region 40 of the display device may be coincident at the straight line m.

When the grating layer 31 is a parallax barrier, the slit centerline at the center of the parallax barrier is coincident with the slit between the left-viewing-field pixel-electrode and the right-viewing-field pixel-electrode at the center of the display screen. In addition, the number of the slits of the parallax barrier is a half of the total number of the left-viewing-field pixel-electrodes and the right-viewing-field pixel-electrodes.

Figure 10A:
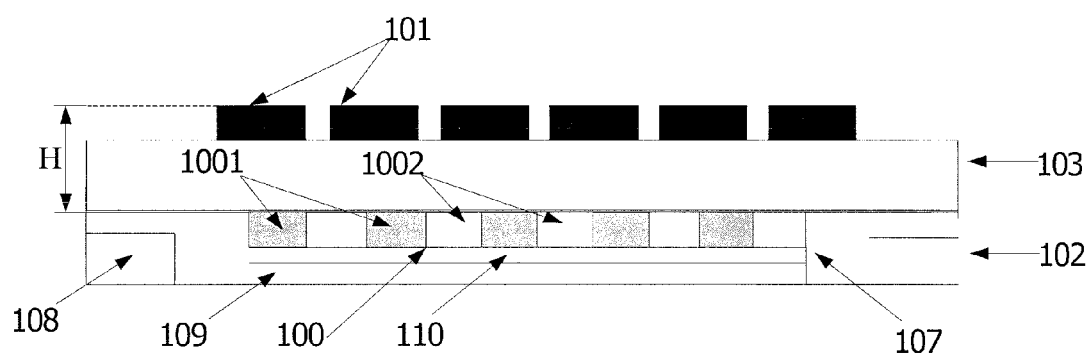
FIG. 10a is a schematic structural diagram of a 3D-OLED display device provided by an embodiment of the invention.

A three-dimensional organic light-emitting diode (3D-OLED) display device provided by an embodiment of the present invention is as shown in FIG. 10a, and the display device may comprise: a grating layer 101, a TFT array substrate 102 and an encapsulation layer 103.

Figure 10B:
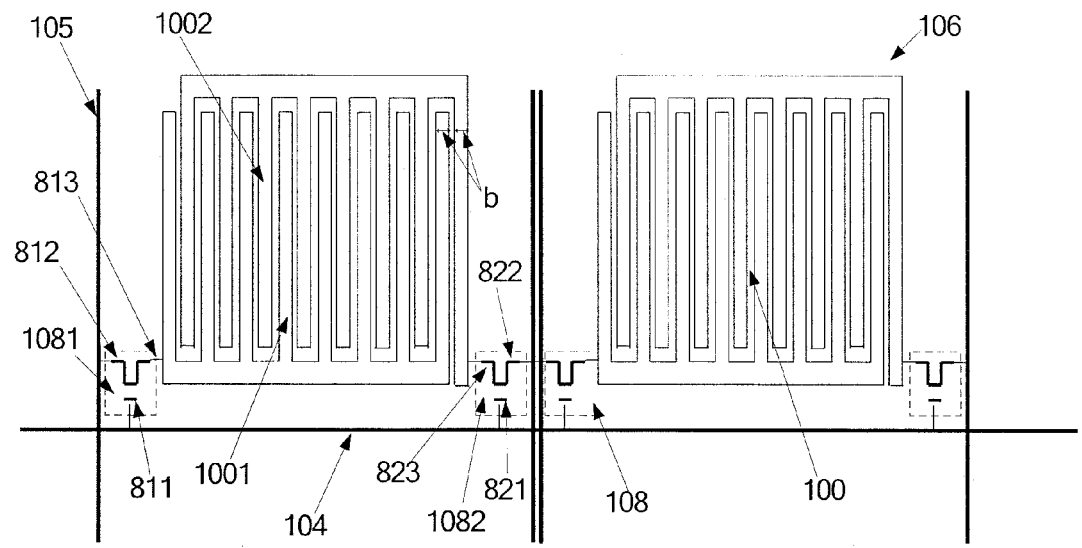
FIG. 10b is a schematic structural diagram of a TFT array substrate of a 3D-OLED display device provided by an embodiment of the invention.

The grating layer 101 may comprise a parallax barrier or a lens-grating; the TFT array substrate 102 is an example of an array substrate, as shown in FIG. 10b, which comprises a plurality of pixel-units 106 divided by gate lines 104 and data lines 105 intersecting one another horizontally and vertically, each pixel-unit 106 comprising an EL layer 107 and a control-circuit 108.

As shown in FIG. 10a, the EL layer 107 may comprise: a metal cathode 109, a pixel-electrode 100, and an organic light-emitting material 110 located between the metal cathode 109 and the pixel-electrode 100.

The pixel-electrode 100 of each pixel-unit 106 comprises mutually-spaced at least two left-viewing-field pixel-electrodes 1001 and at least two right-viewing-field pixel-electrodes 1002.

The control-circuit 108 of each pixel-unit 106 comprises a first sub-control-circuit 1081 connected with the left-viewing-field pixel-electrodes 1001 and a second sub-control-circuit 1082 connected with the right-viewing-field pixel-electrodes 1002.

The 3D-OLED display device provided by the embodiment of the present invention, by modifying a sub-pixel-electrode, which is used for displaying a certain viewing-field, in one pixel-unit in prior art into mutually-spaced left-viewing-field pixel-electrodes and right-viewing-field pixel-electrodes, significantly reduces the width of a single viewing-field pixel-electrode. The reduction of the width of the single viewing-field pixel-electrode can reduce the thickness of the grating layer. For example, when the grating layer is a parallax barrier, the reduction in the thickness of the parallax barrier makes it possible that the parallax barrier can be manufactured directly within the cell of the display device, without a layer of parallax barrier being additionally manufactured on the display device which has been formed by cell-assembling; when the grating layer is a lens-grating, the reduction of the thickness of the lens-grating can reduce the arch-height of the lenticular lens. Thus, the production requirements can be met with the existing manufacturing processes, which can avoid adding new processes or employing new production equipments, thereby reducing production costs.

It should be noted that, the mutually-spaced at least two left-viewing-field pixel-electrodes 1001 and at least two right-viewing-field pixel-electrodes 1002 may be both elongated strip-like electrodes. These mutually-spaced at least two left-viewing-field pixel-electrodes 1001 and at least two right-viewing-field pixel-electrodes 1002 may be parallel to the gate lines 104, or may be parallel to the data lines 105. For the 3D-OLED display device provided by the embodiment of the present invention, a description is given by taking the example that the mutually-spaced at least two left-viewing-field pixel-electrodes 1001 and at least two right-viewing-field pixel-electrodes 1002 are parallel to the data lines 105.

As in an OLED display device, there may be provided a plurality of TFT circuits. The control-circuit involved in the embodiment of the present invention refers to a portion of the TFT circuits that are used for controlling the pixel-electrodes. Specifically, the control-circuit may comprise: a switch-TFT circuit for controlling power-on/off of the pixel-electrodes, and a driver-TFT circuit for controlling the potential variation of the pixel-electrodes.

Further, as shown in FIG. 10b, in each pixel-unit 106, all the left-viewing-field pixel-electrodes 1001 constitute a first comb-like structure, and all the right-viewing-field pixel-electrodes 1002 constitute a second comb-like structure, the first comb-like structure and the second comb-like structure being disposed mutually-interdigitated; that is, all the left-viewing-field pixel-electrodes 1001 and all the right-viewing-field pixel-electrodes 1002 are mutually-spaced in a comb-like structure as a whole.

Preferably, the left-viewing-field pixel-electrode 1001 and the right-viewing-field pixel-electrode 1002 may have an equal width; in this embodiment, they both have a width "b," which may be 1-20 µm. Of course, the left-viewing-field pixel-electrode 1001 and the right-viewing-field pixel-electrode 1002 may not have an equal width as well.

Preferably, in each pixel-unit 106, the left-viewing-field pixel-electrodes 1001 and the right-viewing-field pixel-electrodes 1002 are equal in number, in which case a better display effect can be achieved. In the embodiment shown in FIG. 10b, in each pixel-unit 106, the numbers of the left-viewing-field pixel-electrodes 1001 and the right-viewing-field pixel-electrodes 1002 both are 8.

In this embodiment, the first sub-control-circuit 1081 and the second sub-control-circuit 1082 in FIG. 10b are only given for illustrative purpose and do not represent the actual structures of the components; for example, the reference numerals 811, 812 and 813 (or 821, 822 and 823) may not necessarily the gate, source, and drain of a same TFT (a switch-TFT or a driver-TFT) but may belong to different TFTs.

The gate 811 of the switch-TFT of the first sub-control-circuit 1081 and the gate 821 of the switch-TFT of the second sub-control-circuit 1082 may be connected with a same gate line 104; the source 812 of the switch-TFT of the first sub-control-circuit 1081 and the source 822 of the switch-TFT of the second sub-control-circuit 1082 may be respectively connected with the data lines 1051 and 1052 on both sides of one pixel-unit; the drain 813 of the driver-TFT of the first sub-control-circuit 1081 may be connected with the left-viewing-field pixel-electrodes 1001, and the drain 823 of the driver-TFT of the second sub-control-circuit 1082 may be connected with the right-viewing-field pixel-electrodes 1002. The connection relationship between the driver-TFT and the switch-TFT of the first sub-control-circuit, and the connection relationship between the driver-TFT and the switch-TFT of the second sub-control-circuit, may be set in any manner according to prior art on the premise that the OLED's driving conditions are met, which is not repeated here.

Thus, the pixel-electrodes of a same viewing-field share a same data line, a same gate line and a same sub-control-circuit, so that the aperture ratio of the pixels is decreased limitedly, thereby avoiding the problem that the aperture ratio of the display device is decreased significantly.

Furthermore, when the grating layer 101 is a parallax barrier, the parallax barrier may be located above or below the encapsulation layer 103 and is away from the EL layer 107 by 1-100 µm.

When the grating layer 31 is a lens-grating, the lens-grating may be located above the encapsulation layer 103.

Figure 11:
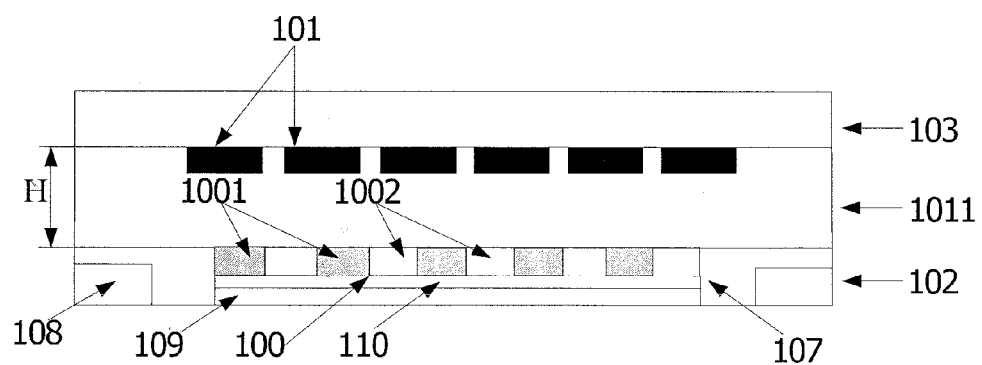
FIG. 11 is a schematic structural diagram of another 3D-OLED display device provided by an embodiment of the invention.

When the grating layer 31 is a parallax barrier and the parallax barrier is located below the encapsulation layer 103, as shown in FIG. 11, a transparent layer 1011 having a thickness of 1-100 µm may be provided between the parallax barrier and the pixel-electrode 100.

The transparent layer 1011 may be a vacuum layer or a gas layer, and a transparent spacer (for example a plastic thin-film) also may be used as the transparent layer. For example, a plastic thin-film or a silicone rubber thin-film may be used to form the transparent layer. The transparent layer 1011 is mainly used to create a space of a certain height between the grating layer 101 and the EL layer 107, and the thickness of the transparent layer 1011 is the distance H between the parallax barrier and a light-emitting point of the display unit.

When the grating layer 31 is a parallax barrier and the parallax barrier is located above the encapsulation layer 103, the example is shown in FIG. 10a.

The parallax barrier may be located directly on the upper surface of the encapsulation layer 103, and the distance between the parallax barrier and a light-emitting point of the display unit is H.

When the grating layer 31 is a lens-grating, the lens-grating may comprise a liquid crystal lens grating or a lenticular lens grating.

Figure 12:
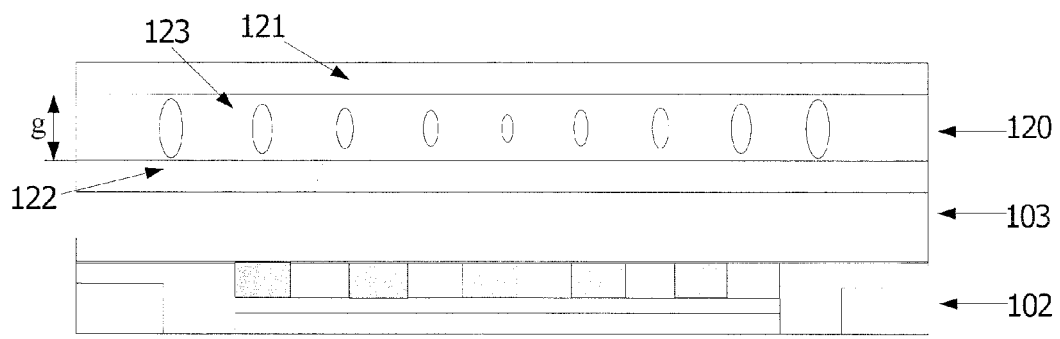
FIG. 12 is a schematic structural diagram of further another 3D-OLED display device provided by an embodiment of the invention.

Further, when the grating layer 101 is a liquid crystal lens, as shown in FIG. 12, the liquid crystal lens 120 comprise an upper electrode 121 and a lower electrode 122; liquid crystal is filled between the upper electrode 121 and the lower electrode 122 to form a liquid crystal layer 123, and the height "g" of the liquid crystal cell is the arch-height of the lenticular lens. Referring to the embodiment described along with FIG. 7, with such a structure, the voltage distribution on the electrodes is controlled so that the liquid crystal molecules in different positions are controlled to deflect to realize the function as a lenticular lens. Thus, when the upper electrode 121 and the lower electrode 122 are not energized, the liquid crystal molecules do not deflect, so that the display device can perform 2D-mode display; when the upper electrode 121 and the lower electrode 122 are energized, the liquid crystal molecules deflect, so that the display device can perform 3D-mode display.

Figure 13:
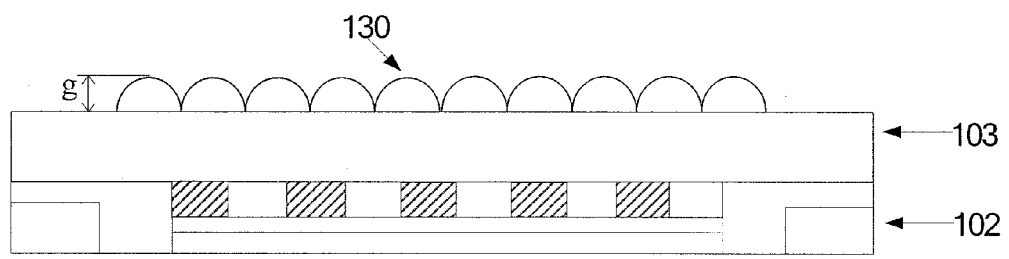
FIG. 13 is a schematic structural diagram of still another 3D-OLED display device provided by an embodiment of the invention.

When the grating layer 101 is a lenticular lens grating, as shown in FIG. 13, with reference to the embodiment of FIG. 8, the lenticular lens grating 130 may be obtained by firstly depositing a layer of transparent photoresist on the encapsulation layer 103, and then exposing and developing with a grayscale exposure mask plate and different exposure amount, and the arch-height of the lens is g.

Further, the centerline of the grating layer 101 is coincident with the centerline of the display region of the display device.

When the grating layer 101 is a parallax barrier, the slit centerline at the center of the parallax barrier may be coincident with the slit between the left-viewing-field pixel-electrode and right-viewing-field pixel-electrode at the center of the display screen. In addition, the number of the slits of the parallax barrier is a half of the total number of the left-viewing-field pixel-electrodes and the right-viewing-field pixel-electrodes.

Specifically, in the above-described 3D-OLED display device, the structures of the control-circuits and the pixel-electrodes and the connection relationship therebetween may refer to the TFT circuits and the pixel-electrodes in the aforementioned 3D liquid crystal display device (along with the characteristics of an OLED display by itself in prior art), and the beneficial effects of the various structures have been described in detail with the double-viewing-field liquid crystal display device, which is not repeated here.

A manufacturing method of a 3D liquid crystal display device, provided by an embodiment of the present invention, comprises the following steps.

S1401, on a lower substrate, a TFT circuit and a pixel-electrode are formed, for example by a patterning process, in which the pixel-electrode of each pixel-unit comprises mutually-spaced at least two left-viewing-field pixel-electrodes and at least two right-viewing-field pixel-electrodes; the TFT circuit of each pixel-unit comprises a first sub-TFT-circuit connected with the left-viewing-field pixel-electrodes and a second sub-TFT-circuit connected with the right-viewing-field pixel-electrodes. The TFT circuit is an example of a pixel control-circuit in the present invention.

For example, as shown in FIG. 4, all the left-viewing-field pixel-electrodes 4311 are connected with the first sub-TFT-circuit 4321, and all the right-viewing-field pixel-electrodes 4312 are connected with the second sub-TFT-circuit 4322. Each of the left-viewing-field pixel-electrodes 4311 may be connected, through any structure (e.g., a via hole) that can realize circuit conduct, to the first sub-TFT-circuit 4321; each of the right-viewing-field pixel-electrodes 4312 may be connected, through any structure (e.g., a via hole) that can realize circuit conduct, to the second sub-TFT-circuit 4322.

S1402, on an upper substrate, a grating layer and a color-filter are formed, and the grating layer comprises a parallax barrier or a lens-grating.

S1403, the upper and lower substrates are cell-assembled, and liquid crystal is filled within the cell.

The manufacturing method of a 3D liquid crystal display device provided by the embodiment of the present invention, by modifying a sub-pixel-electrode, which is used for displaying a certain viewing-field, in one pixel-unit in prior art into mutually-spaced several left-viewing-field pixel-electrodes and right-viewing-field pixel-electrodes, significantly reduces the width of a single viewing-field pixel-electrode. The reduction of the width of the single viewing-field pixel-electrode can reduce the thickness of the grating layer, when the grating layer is a parallax barrier, the reduction in the thickness of the parallax barrier makes it possible that the parallax barrier can be manufactured directly within the cell of the display device, without a layer of parallax barrier being additionally manufactured on the display device which has been formed by cell-assembling; when the grating layer is a lens-grating, the reduction in the thickness of the lens-grating can reduce the arch-height of the lenticular lens. Thus, the production requirements can be met with the existing manufacturing processes, which can avoid adding new processes or employing new production equipments, thereby reducing production costs.

It should be noted that, the mutually-spaced at least two left-viewing-field pixel-electrodes and at least two right-viewing-field pixel-electrodes are all elongated strip-like electrodes. These mutually-spaced at least two left-viewing-field pixel-electrodes and at least two right-viewing-field pixel-electrodes may be parallel to the gate lines, or may be parallel to the data lines. For the 3D liquid crystal display device provided by the embodiment of the present invention, a description is given by taking the example that the mutually-spaced at least two left-viewing-field pixel-electrodes and at least two right-viewing-field pixel-electrodes are parallel to the data lines.

Further, in each pixel-unit, all the left-viewing-field pixel-electrodes constitute a first comb-like structure, and all the right-viewing-field pixel-electrodes constitute a second comb-like structure, the first comb-like structure and the second comb-like structure being disposed mutually-interdigitated; that is, all the left-viewing-field pixel-electrodes and all the right-viewing-field pixel-electrodes may be mutually-spaced in a comb-like structure as a whole.

Both the left-viewing-field pixel-electrodes and the right-viewing-field pixel-electrodes may have a width of 1-20 µm.

The gate of the first sub-TFT-circuit and the gate of the second sub-TFT-circuit may be connected with a same gate line; the source of the first sub-TFT-circuit and the source of the second sub-TFT-circuit may be respectively connected with the data lines on both sides of one pixel-unit; the drain of the first sub-TFT-circuit may be connected with the left-viewing-field pixel-electrodes, and the drain of the second sub-TFT-circuit may be connected with the right-viewing-field pixel-electrodes.

Thus, the pixel-electrodes of a same viewing-field share a same data line, a same gate line and a same TFT, so that the aperture ratio of the pixels is decreased limitedly, thereby avoiding the problem of causing the aperture ratio of the liquid crystal display device to be decreased significantly.

Furthermore, when the grating layer is a parallax barrier, the parallax barrier may be located above or below the color-filter of the upper substrate and may be away from the color-filter by 1-100 µm.

When the grating layer is a lens-grating, the lens-grating may be located above the transparent substrate.

When the grating layer is a parallax barrier and the parallax barrier is located above the color-filter, one example of the step S1402 may comprise: after the color-filter is formed on the upper substrate, a transparent layer having a thickness of 1-100 µm is formed on the color-filter; and then the parallax barrier is formed on the transparent layer.

The transparent layer may be a transparent thin-film formed of any light-transmissive material; for example, a plastic thin-film or a silicone rubber thin-film may be used to form the transparent layer. The transparent layer is mainly used to create a space of a certain height between the grating layer and the color-filter, and the thickness of the transparent layer is the distance H between the parallax barrier and a light-emitting point of the display unit.

When the grating layer is a parallax barrier and the parallax barrier is located below the color-filter, the parallax barrier may be located directly on the upper surface of the TFT array substrate.

When the grating layer is a lens-grating, the lens-grating may comprise a liquid crystal lens grating or a lenticular lens grating.

Further, when the grating layer is a liquid crystal lens, the liquid crystal lens comprises an upper electrode and a lower electrode; liquid crystal is filled between the upper electrode and the lower electrode to form a liquid crystal layer. With such a structure, the voltage distribution on the electrodes is controlled so that the liquid crystal molecules in different positions are controlled to deflect to realize the function as a lenticular lens. Thus, when the upper electrode and the lower electrode are not energized, the liquid crystal molecules do not deflect, so that the display device can perform 2D-mode display; when the upper electrode and the lower electrode are energized, the liquid crystal molecules deflect, so that the display device can perform 3D-mode display.

When the grating layer is a lenticular lens grating, the lenticular lens grating may be obtained by firstly depositing a layer of transparent photoresist on the transparent substrate, and then exposing and developing with a grayscale exposure mask plate and different exposure amount.

In the embodiment of the present invention, the centerline of the grating layer may be coincident with the centerline of the display region of the display device.

The manufacturing method of a 3D-OLED display device, provided by an embodiment of the present invention, may comprise the following steps.

S1501, on a lower substrate, a control-circuit is formed for example by a patterning process.

S1502, on the lower substrate formed with the control-circuit, an EL layer is formed, and the EL layer comprises a metal cathode, a pixel-electrode and an organic light-emitting material located between the metal cathode and the pixel-electrode; the pixel-electrode of each pixel-unit comprises mutually-spaced at least two left-viewing-field pixel-electrodes and at least two right-viewing-field pixel-electrodes; the control-circuit of each pixel-unit comprises a first sub-control-circuit connected with the left-viewing-field pixel-electrodes and a second sub-control-circuit connected with the right-viewing-field pixel-electrodes.

S1503, on an encapsulation layer, a grating layer is formed, and the grating layer comprises a parallax barrier or a lens-grating.

S1504, the encapsulation layer formed with the grating layer is provided to cover the lower substrate.

The manufacturing method of a 3D-OLED display device provided by the embodiment of the present invention, by modifying a sub-pixel-electrode, which is used for displaying a certain viewing-field, in one pixel-unit in prior art into mutually-spaced several left-viewing-field pixel-electrodes and right-viewing-field pixel-electrodes, significantly reduces the width of a single viewing-field pixel-electrode. The reduction of the width of the single viewing-field pixel-electrode can reduce the thickness of the grating layer, when the grating layer is a parallax barrier, the reduction in the thickness of the parallax barrier makes it possible that the parallax barrier can be manufactured directly within the cell of the display device, without a layer of parallax barrier being additionally manufactured on the display device which has been formed by cell-assembling; when the grating layer is a lens-grating, the reduction in the thickness of the lens-grating can reduce the arch-height of the lenticular lens. Thus, the production requirements can be met with the existing manufacturing processes, which can avoid adding new processes or employing new production equipments, thereby reducing production costs.

It should be noted that, the mutually-spaced at least two left-viewing-field pixel-electrodes and at least two right-viewing-field pixel-electrodes are all elongated strip-like electrodes. These mutually-spaced at least two left-viewing-field pixel-electrodes and at least two right-viewing-field pixel-electrodes may be parallel to the gate lines, or may be parallel to the data lines. For the 3D-OLED display device provided by the embodiment of the present invention, a description is given by taking the example that the mutually-spaced at least two left-viewing-field pixel-electrodes and at least two right-viewing-field pixel-electrodes are parallel to the data lines.

As in an OLED display device, there may be provided a plurality of TFT circuits, the control-circuit involved in the embodiment of the present invention refers to a portion of the TFT circuits that are used for controlling the pixel-electrodes. Specifically, the control-circuit may comprise: a switch-TFT circuit for controlling power-on/off of the pixel-electrodes and a driver-TFT circuit for controlling the potential variation of the pixel-electrodes.

Further, in each pixel-unit, all the left-viewing-field pixel-electrodes constitute a first comb-like structure, and all the right-viewing-field pixel-electrodes constitute a second comb-like structure, the first comb-like structure and the second comb-like structure being disposed mutually-interdigitated; that is, all the left-viewing-field pixel-electrodes and all the right-viewing-field pixel-electrodes are mutually-spaced in a comb-like structure as a whole. Preferably, the leftviewing-field pixel-electrode and the right-viewing-field pixel-electrode have an equal width; in this embodiment, they may both have a width of 1-20 μm. Of course, the left-viewing-field pixel-electrode and the right-viewing-field pixel-electrode also may not have an equal width. Preferably, in each pixel-unit, the left-viewing-field pixel-electrodes and the right-viewing-field pixel-electrodes are equal in number, in which case a better display effect can be achieved.

The gate of the switch-TFT of the first sub-control-circuit and the gate of the switch-TFT of the second sub-control-circuit may be connected with a same gate line; the source of the switch-TFT of the first sub-control-circuit and the source of the switch-TFT of the second sub-control-circuit may be respectively connected with the data lines on both sides of one pixel-unit; the drain of the driver-TFT of the first sub-control-circuit may be connected with the left-viewing-field pixel-electrodes, and the drain of the driver-TFT of the second sub-control-circuit may be connected with the right-viewing-field pixel-electrodes.

Thus, the pixel-electrodes of a same viewing-field share a same data line, a same gate line and a same control, so that the aperture ratio of the pixels is decreased limitedly, thereby avoiding the problem of causing the aperture ratio of the display device to be decreased significantly.

Furthermore, when the grating layer is a parallax barrier, the parallax barrier may be located above or below the encapsulation layer and may be away from the EL layer by 1-100 μm.

When the grating layer is a lens-grating, the lens-grating may be located above the encapsulation layer.

When the grating layer is a parallax barrier and the parallax barrier is located below the encapsulation layer, after the EL layer is formed on the lower substrate formed with the control-circuit, the manufacturing method of a 3D-OLED display device may further comprise: a transparent layer having a thickness of 1-100 μm is formed on the EL layer.

The transparent layer may be a vacuum layer or a gas layer, and a transparent spacer (such as a plastic thin-film) also may be used as the transparent layer. For example, a plastic thin-film or a silicone rubber thin-film may be used to form the transparent layer. The transparent layer is mainly used between the grating layer and the EL layer to create a space of a certain height, and the thickness of the transparent layer is the distance H between the parallax barrier and a light-emitting point of the display unit.

When the grating layer is a parallax barrier and the parallax barrier is located above the encapsulation layer, the parallax barrier may be located directly on the upper surface of the encapsulation layer.

When the grating layer is a lens-grating, the lens-grating may comprise a liquid crystal lens grating or a lenticular lens grating.

Further, when the grating layer is a liquid crystal lens, the liquid crystal lens comprises an upper electrode and a lower electrode; liquid crystal is filled between the upper electrode and the lower electrode to form a liquid crystal layer. With such a structure, the voltage distribution on the electrodes is controlled so that the liquid crystal molecules in different positions are controlled to deflect to realize the function as a lenticular lens. Thus, when the upper electrode and the lower electrode are not energized, the liquid crystal molecules do not deflect, so that the display device can perform 2D-mode display; when the upper electrode and the lower electrode are energized, the liquid crystal molecules deflect, so that the display device can perform 3D-mode display.

When the grating layer is a lenticular lens grating, the lenticular lens grating may be obtained by firstly depositing a layer of transparent photoresist on the encapsulation layer, and then exposing and developing with a grayscale exposure mask and different exposure amount.

In the embodiment of the present invention, the centerline of the grating layer may be coincident with the centerline of the display region of the display device.

It should be noted that, the upper substrate, involved in the manufacturing method of a double-viewing-field OLED display device provided by the embodiment of the present invention, may all refer to an encapsulation layer used for encapsulating an OLED display device.

The above description involves only the exemplary implementations of the present invention, but not for limiting the scope of the invention; instead, the scope of the invention should be defined by the appended claims.

The invention claimed:

1. A three-dimensional organic light-emitting diode (3D-OLED) display device, comprising: a grating layer, an array substrate and an encapsulation layer,
   wherein, the grating layer comprises a parallax barrier or a lens-grating; the array substrate comprises a plurality of pixel-units divided by gate lines and data lines intersecting one another horizontally and vertically, each pixel-unit comprising an electroluminescent EL layer and a control-circuit; the EL layer comprises a metal cathode, a pixel-electrode configured for an anode and an organic light-emitting material located between the metal cathode and the pixel-electrode,
   wherein, the pixel-electrode of each pixel-unit comprises mutually-spaced at least two left-viewing-field pixel-electrodes and at least two right-viewing-field pixel-electrodes, and a width of the left-viewing-field pixel-electrodes is different from that of the right-viewing-field pixel-electrodes; and
   the control-circuit of each pixel-unit comprises a first sub-control-circuit connected with the left-viewing-field pixel-electrodes and a second sub-control-circuit connected with the right-viewing-field pixel-electrodes.

2. The display device according to claim 1, wherein, in each pixel-unit, all the left-viewing-field pixel-electrodes constitute a first comb-like structure, and all the right-viewing-field pixel-electrodes constitute a second comb-like structure, the first comb-like structure and the second comb-like structure being disposed mutually-interdigitated.

3. The display device according to claim 1, wherein the widths of the left-viewing-field pixel-electrodes and the right-viewing-field pixel-electrodes are in the range of 1-20 μm.

4. The display device according to claim 1, wherein a gate of a switch-TFT of the first sub-control-circuit and a gate of a switch-TFT of the second sub-control-circuit are connected with a same gate line; a source of the switch-TFT of the first sub-control-circuit and a source of the switch-TFT of the second sub-control-circuit are respectively connected with data lines on both sides of one pixel-unit; a drain of a driver-TFT of the first sub-control-circuit is connected with the left-viewing-field pixel-electrodes, and a drain of a driver-TFT of the second sub-control-circuit is connected with the right-viewing-field pixel-electrodes.

5. The display device according to claim 1, wherein,
   when the grating layer is a parallax barrier, the parallax barrier is located above or below the encapsulation layer and is away from the EL layer by 1-100μm ; or
   when the grating layer is a lens-grating, the lens-grating is located above the encapsulation layer.

6. The display device according to claim 5, wherein, when the parallax barrier is located below the encapsulation layer, a transparent layer having a thickness of 1-100 μm is provided between the parallax barrier and the pixel-electrode.

7. The display device according to claim 5, wherein the lens-grating comprises a liquid crystal lens or a lenticular lens grating.

8. The display device according to claim 1, wherein a centerline of the grating layer is coincident with a centerline of the display region of the display device.

9. A manufacturing method of a 3D-OLED display device, comprising:
   on a lower substrate, forming a control-circuit;
   on the lower substrate formed with the control-circuit, forming an EL layer, wherein, the EL layer comprises a metal cathode, a pixel-electrode configured for an anode and an organic light-emitting material located between the metal cathode and the pixel-electrode; the pixel-electrode of each pixel-unit comprises mutually-spaced at least two left-viewing-field pixel-electrodes and at least two right-viewing-field pixel-electrodes; the control-circuit of each pixel-unit comprises a first sub-control-circuit connected with the left-viewing-field pixel-electrodes and a second sub-control-circuit connected with the right-viewing-field pixel-electrodes, and a width of the left-viewing-field pixel-electrodes is different from that of the right-viewing-field pixel-electrodes;
   on an encapsulation layer, forming a grating layer, the grating layer comprising a parallax barrier or a lens-grating; and
   disposing the encapsulation layer formed with the grating layer to cover the lower substrate.

10. The manufacturing method according to claim 9, wherein, in each pixel-unit, all the left-viewing-field pixel-electrodes constitute a first comb-like structure, and all the right-viewing-field pixel-electrodes constitute a second comb-like structure, the first comb-like structure and the second comb-like structure being disposed mutually-interdigitated.

11. The display device according to claim 9, wherein the widths of the left-viewing-field pixel-electrodes and the right-viewing-field pixel-electrodes are in the range of 1-20 μm.

* * * * *